United States Patent [19]

Uchiyama et al.

[11] Patent Number: 5,194,944
[45] Date of Patent: Mar. 16, 1993

[54] IMAGE SIGNAL PROCESSING APPARATUS FOR SUCCESSIVELY TRANSFERRING A SERIES OF COLOR SIGNALS OBTAINED AS IMAGE SIGNALS

[75] Inventors: Masayuki Uchiyama; Fumiyoshi Itoh, both of Nagano, Japan

[73] Assignee: Chinon-Kabushiki Kaisha, Nagano, Japan

[21] Appl. No.: 691,729

[22] Filed: Apr. 26, 1991

[30] Foreign Application Priority Data

May 1, 1990 [JP] Japan .................................. 2-115523

[51] Int. Cl.$^5$ .......................... H04N 9/07; H04N 9/73
[52] U.S. Cl. ....................................... 358/41; 358/43; 358/44; 358/29
[58] Field of Search ................... 358/41, 43, 44, 29, 358/29 C, 213.25

[56] References Cited

U.S. PATENT DOCUMENTS

| | | |
|---|---|---|
| 4,758,883 | 7/1988 | Kawahara .............................. 358/41 |
| 4,814,861 | 3/1989 | Hieda .................................. 358/29 C |
| 4,870,495 | 9/1989 | Kinoshita ............................... 358/44 |
| 4,935,808 | 6/1990 | Hashimoto ............................ 358/44 |
| 4,985,758 | 1/1991 | Hashimoto ............................ 358/41 |
| 5,034,804 | 7/1991 | Sasaki .................................. 358/41 |

Primary Examiner—Victor R. Kostak
Assistant Examiner—Sherrie Hsia

[57] ABSTRACT

An image signal processing apparatus includes a vertical register for storing and transferring color signals obtained as image signals related to at least three primary colors, a horizontal register for receiving the color signals transferred from the vertical register and a transfer controller for succeedingly transferring a series of color signals for every color composed of a series of data or one and the same color for one line related to the three primary colors, to the horizontal register in every horizontal blanking period, and for successively transferring and outputting the series of color signals transferred to the horizontal register. As a result, the image signal processing apparatus is made of a small size at a reduced cost by simplifying the circuit configuration.

5 Claims, 9 Drawing Sheets

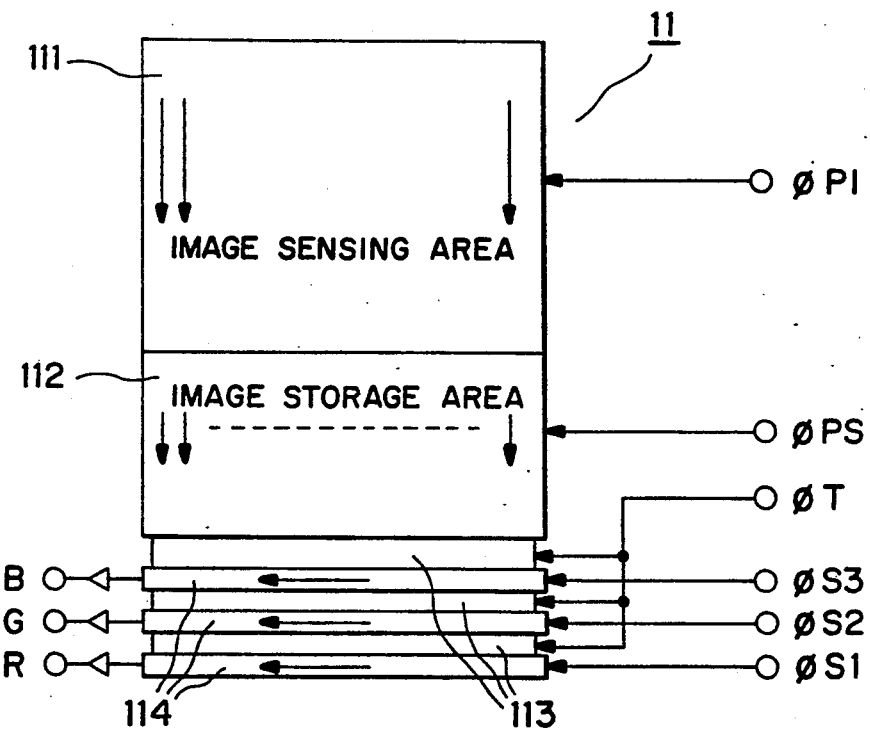
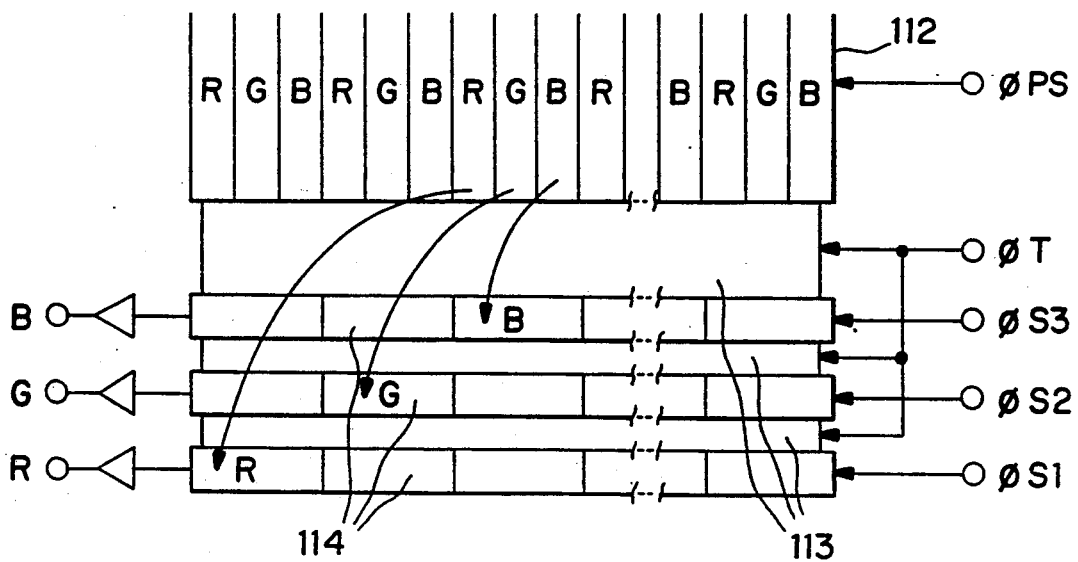

0
IMAGE SIGNAL PROCESSING APPARATUS FOR SUCCESSIVELY TRANSFERRING A SERIES OF COLOR SIGNALS OBTAINED AS IMAGE SIGNALS

BACKGROUND OF THE INVENTION

1. Field of the Invention

The present invention relates to an image signal processing apparatus which is used for an electronic still camera or the like, and in which the transfer control of an image signal sent from an image pickup element is improved in connection with the encoding of the image signal.

2. Description of the Prior Art

As an apparatus for converting an optical image into an image signal through an image pickup element and for storing the image signal as digital data into a storage device, there is, for example, a digital-type electronic still camera. In the electronic still camera, image data compression is essential in order to store a bulky amount of digital image data in a storage device of a given capacity. As the method of image data compression, conventionally, there have been proposed various methods. For example, known methods are a DPCM system using a correlation between picture elements adjacent to each other, a DCT system in which a picture area is divided into n x n picture element areas (blocks) composed of n columns of picture elements and rows of picture elements and a correlation in which every block is used.

FIG. 9 is a block diagram showing an example of the signal processing in an electronic still camera employing the DPCM system. This example will be described hereunder.

An image signal produced from an image pickup element 11 such as a CCD or the like is amplified by an amplifier 12, and the amplified signal is separated into three color signals, for example, red, green, and blue (R, G, B) color signals, by a color separation circuit 13. Then, the color signals R, G, and B are processed by gamma circuits 14 and white balance circuits 15 respectively, converted into digital signals by A/D conversion circuits 16 respectively, and stored in a field memory 17. The field memory 17 is used as a buffer memory for a DPCM encoding circuit 18.

The DPCM encoding circuit 18 serves to encode the image data which is converted into the digital signal and read from the field memory 17 in the order of color frames or in the order of color lines. FIG. 10 shows the configuration of the DPCM encoding circuit 18. That is, in the DPCM encoding circuit 18, a predicted value $X_0$ (obtained by predicting a value at the present point of time on the basis of a sampled value/values at a sample point/points before the present point of time) is subtracted from a sampled value $x_0$ at the present point of time by means of a subtracter 81 to thereby obtain a prediction error signal $\epsilon_0$. The prediction error signal $\epsilon_0$ obtained as a result of the subtraction is outputted after being non-linearly converted by a non-linear converter 82. The predicted value may be obtained, for example, by a method using a sampled value at a sampling point one picture element before the present point of time (hereinafter referred to as a previous-sample-prediction method).

Reference numeral 83 designates a local decoder portion which serves to prevent accumulation of errors generated in the decoding operation. In the local decoder portion 83, a non-linear reverse converter 84 serves to reversely convert an output of the non-linear converter 82, and an adder 85 serves to add a prediction error signal which is an output of the non-linear reverse converter 84 to the above-mentioned predicted value, the result of addition being supplied to a predictor 86.

The image data encoded in the DPCM encoding circuit 18 is written, through a buffer memory 19, into an image data storage medium such as an IC memory card or the like in a storage device 20. The buffer memory 19 serves to finally write the image data into a storage medium 20a while controlling the rate of data transfer between the DPCM encoding circuit 18 and the image data storage medium 20.

In FIG. 9, a CCD driving circuit 21 serves to operate a CCD used as the image pickup element 11. Further, a timing generation circuit 22 is controlled by a system control circuit 23 so as to supply timing signals at predetermined points of time to various circuits 13 through 21 to thereby operate those circuits 13 through 21.

In such a configuration, the gamma circuit 14, the white balance circuit 15, and the A/D conversion circuit 16 are required for each of the color signals of R, G, and B. Further, all the color signal R, G, and B separated by the color separation circuit 13 are simultaneously outputted from the color separation circuit 13. Accordingly, if the field memory 17 were not provided, it would be necessary to provide the DPCM encoding circuit 18 for each of the color signals of R, G, and B. It is however difficult to actually realize such a configuration, and, therefore, it is necessarily required to provide, in a camera, a buffer memory, such as a field memory 17 as mentioned above or a frame memory, of a large capacity.

Thus, in the conventional case, it has been necessary to provide three sets of the gamma circuits 14, the white balance circuits 15, and the A/D conversion circuits 16 for the respective R, G, and B color signals and the field memory 17 or the like which is a large-capacity buffer memory. As a result, the circuit scale and cost is prevented from being reduced so that the apparatus cannot be made inexpensive.

SUMMARY OF THE INVENTION

It is therefore an object of the present invention to provide an image signal processing apparatus in which the whole apparatus is made small-sized and the cost is reduced by simplifying the circuit configuration.

In order to attain the above object, according to an aspect of the present invention, the image signal processing apparatus comprises vertical register means for storing and transferring color signals obtained as image signals related to at least three primary colors, horizontal register CCD means for receiving the color signals transferred from the vertical register means, and transfer control means for succeedingly transferring a series of color signals for every color composed of a series of data of one and the same color for one line related to the three primary colors, to the horizontal register CCD means in every horizontal blanking period, and for successively transferring and outputting the series of color signals transferred to the horizontal register CCD means.

Preferably, according to a second aspect of the present invention, in the image signal processing apparatus mentioned above, a transferring and outputting clock pulse frequency is selected so as to correspond to a lower one of a processing rate of an encoding circuit for encoding image data on the basis of the transferred and outputted signals and a storing rate of a storage medium for storing the encoded image data.

More preferably, according to a third aspect of the present invention, the image signal processing apparatus mentioned above further comprises a white balance circuit for processing the transferred and outputted color signals, the white balance circuit having a white-balancing amplification factor is changed to have a value suitable for white balance processing of a corresponding color signal in synchronism with an output timing of each series of the color signals.

According to the first aspect of the present invention, since a series of color signals for every color composed of a series of data of one and the same color for one line obtained as an image signal are succeedingly transferred and outputted from the horizontal register CCD means, it is enough to provide only one system of various kinds of the following circuits. As a result, the circuit scale can be made small and the cost can be made low.

Further, according to the second aspect of the present invention, the transferring and outputting clock pulse frequency is selected so as to correspond to a lower one of a processing rate of an encoding circuit for encoding image data on the basis of the transferred and outputted signals and a storing rate of a storage medium for storing the encoded image data. Accordingly, a large capacity of field memory and buffer memory become unnecessary.

Further, according to the third aspect of the present invention, the white-balancing amplification factor is changed to have a value suitable for white balance processing of a corresponding color signal in synchronism with an output timing of each series of the color signals. Accordingly, the white balance processing suitable for each color can be carried out.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3 is a front view for explaining the configuration of the image pickup element of FIG. 1;

FIG. 4 is a front view for explaining general transfer operation of signal charges by the image pickup element of FIG. 3;

DETAILED DESCRIPTION OF THE PREFERRED EMBODIMENTS OF THE PRESENT INVENTION

Figure 1:
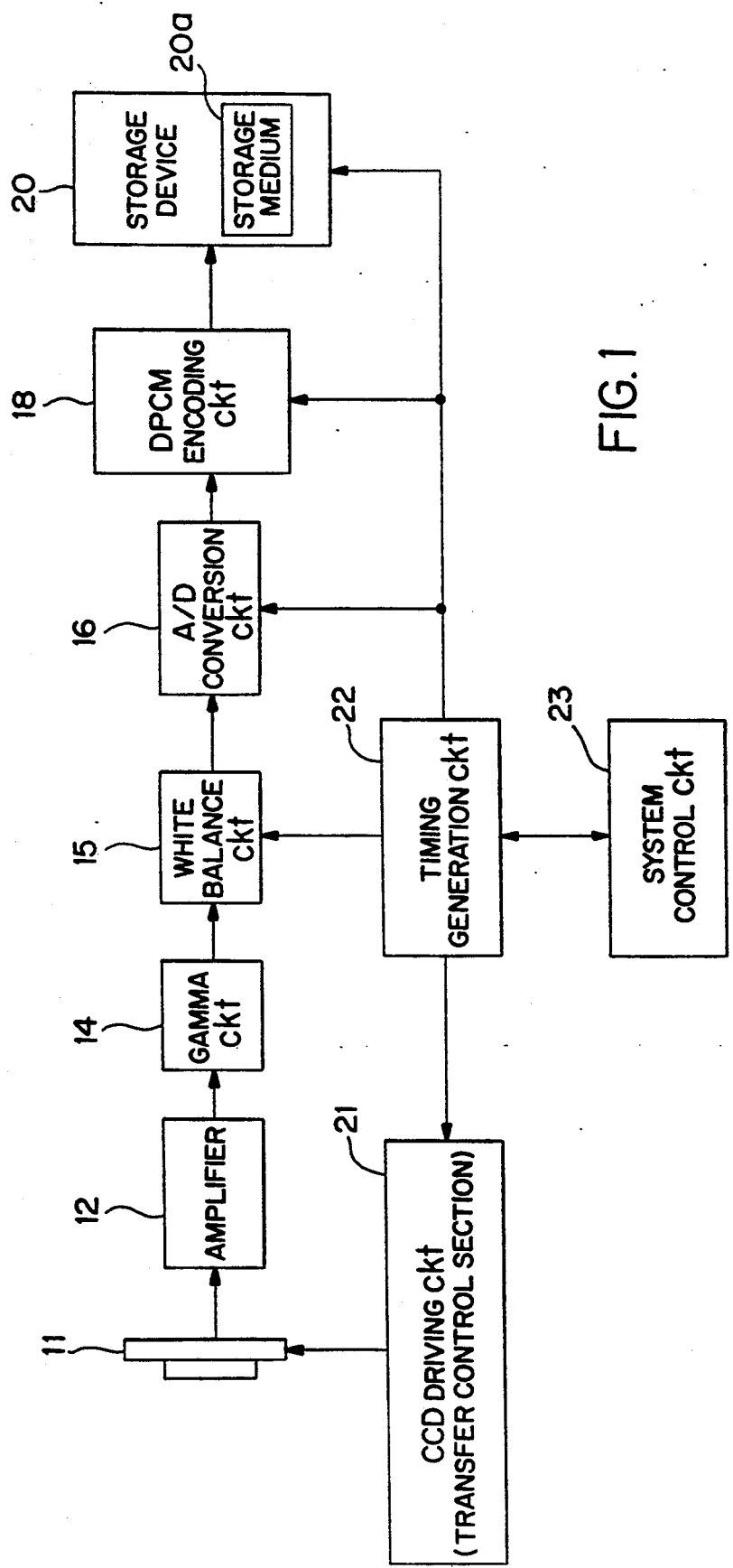
FIG. 1 is a block diagram showing an embodiment of the image signal recording apparatus according to the present invention.

Referring to the drawings, an embodiment of the image signal processing apparatus according to the present invention will be described hereunder.

Figure 9:
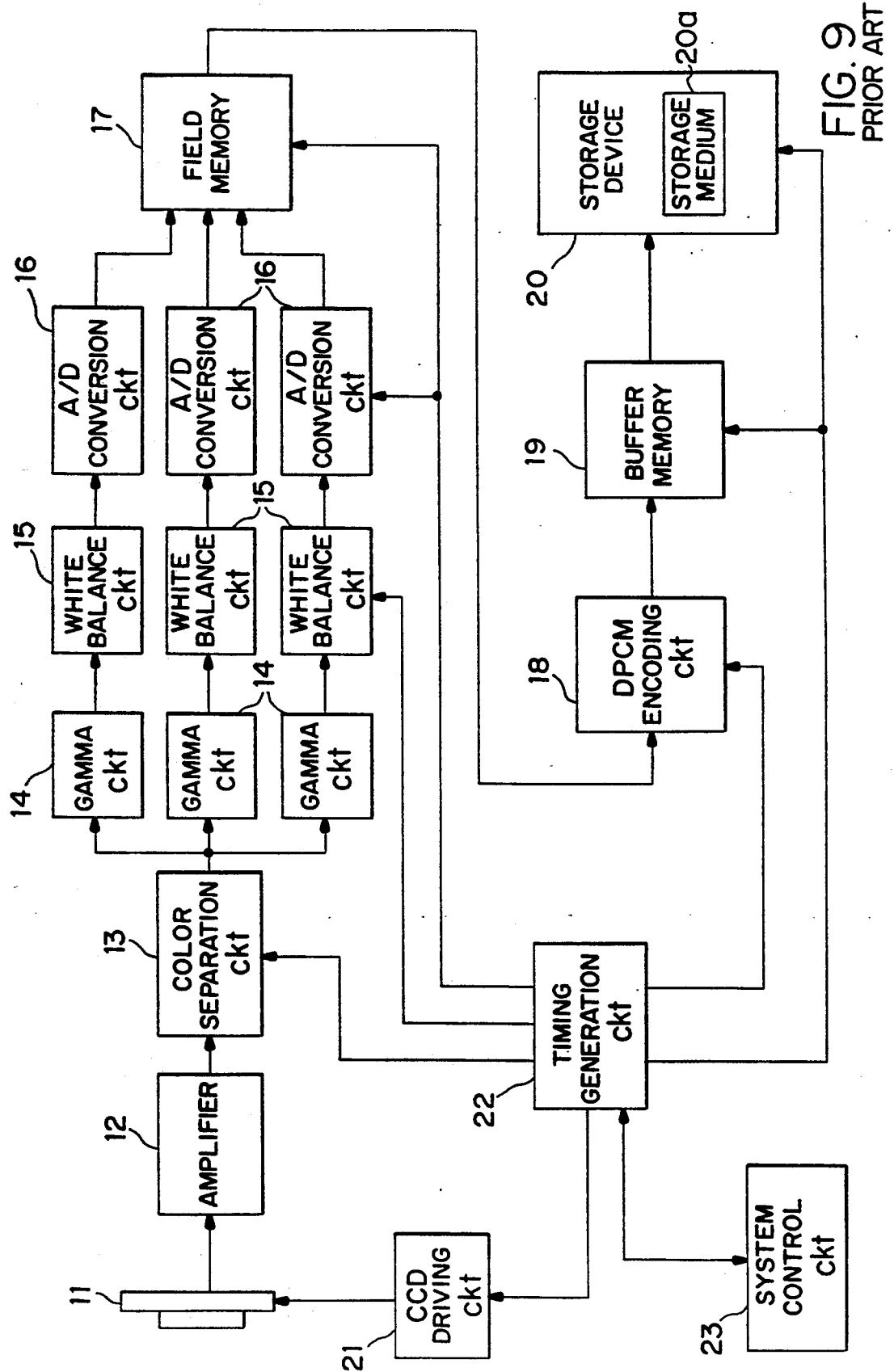
FIG. 9 is a block diagram for explaining a conventional apparatus.

In the image signal processing apparatus according to the present embodiment and shown in FIG. 1, although a CCD 11 is provided as an image pickup element and an image signal produced from the CCD 11 is amplified by an amplifier 12 similarly to the conventional apparatus shown in FIG. 9. However, the color separation circuit 13 illustrated in FIG. 9 of the conventional apparatus is not used in the present embodiment, the amplified signal is processed by a gamma-circuit 14 and a white balancing circuit 15 in one system, and the processed signal is converted into a digital signal in an A/D converter 16. The image data converted into the digital signal is directly applied to a DPCM encoding circuit 18 (without passing the field memory 17 as shown in FIG. 9 of the conventional apparatus) so as to be encoded, and the encoded data is written in an image data storage medium 20a such as an IC memory card or the like of a storage device 20 (without passing the buffer memory 19 shown in FIG. 9 of the conventional apparatus).

Figure 2:
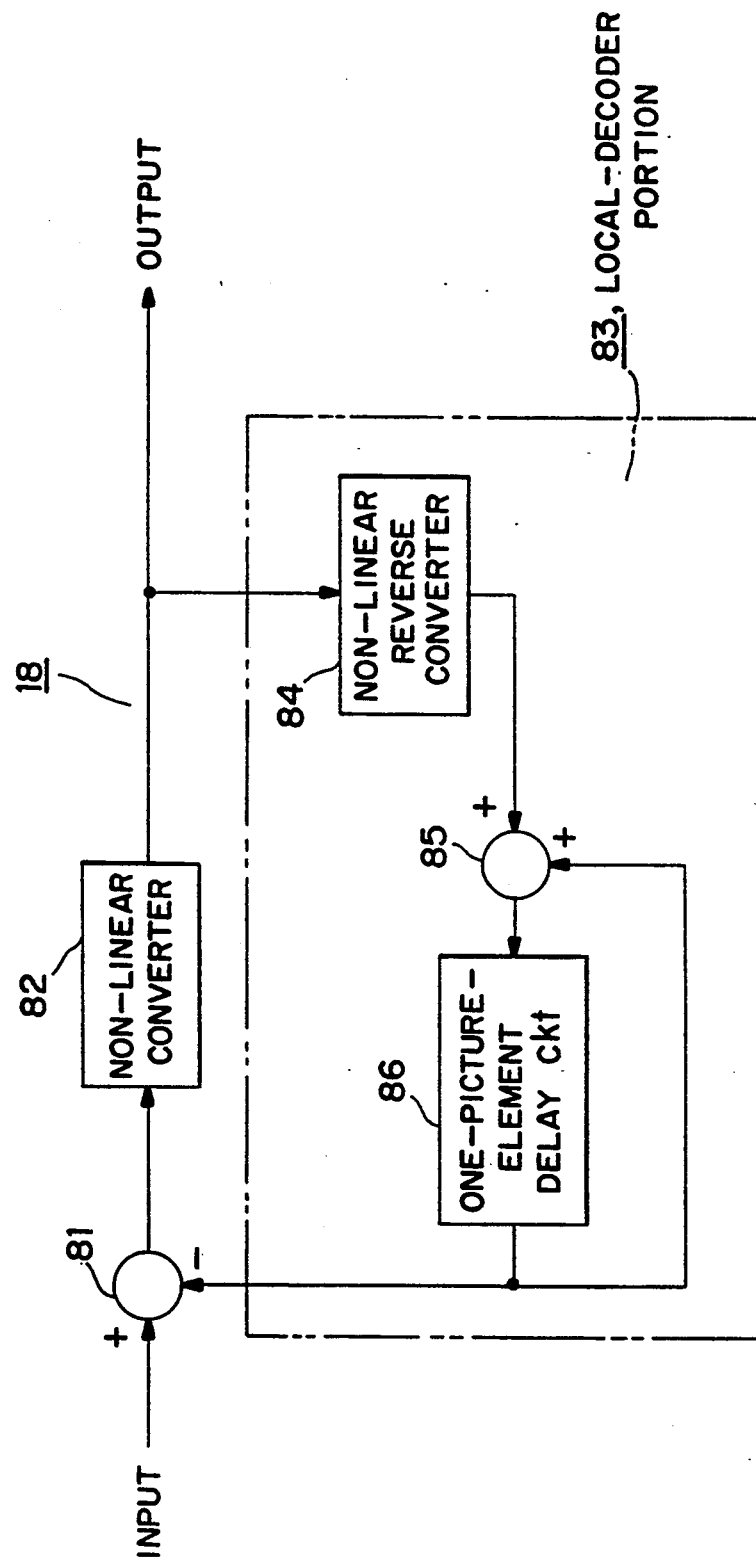
FIG. 2 is a block diagram showing an example of the configuration of the encoding circuit of FIG. 1.
Figure 10:
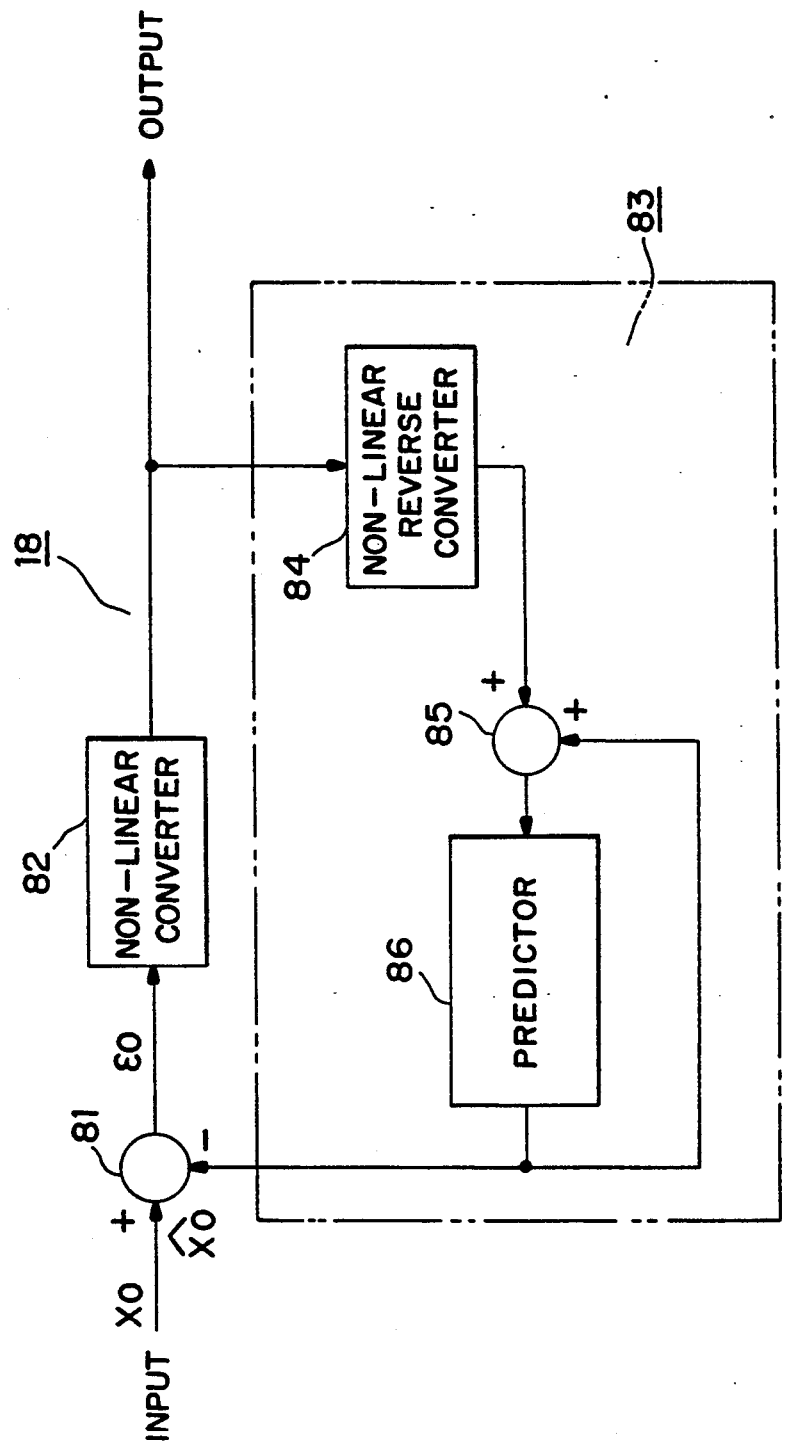
FIG. 10 is a block diagram showing the configuration of the encoding circuit of FIG. 9.

The DPCM encoding circuit 18 has a configuration shown in FIG. 2. The configuration of FIG. 2 is basically the same as the configuration in FIG. 10 of the conventional apparatus and in FIG. 2, the same or that of FIG. 10 and in FIG. 2, and those the same as or equivalent elements and circuits to those in FIG. 10 are correspondingly referenced. The DPCM encoding circuit 18 employs the above-mentioned previous-sample-prediction method. For the prediction, since a picture-element data one picture element before is used as a predicted value, an one- picture-element delay circuit is used as the predictor 86 in this embodiment.

In this embodiment, a CCD driving circuit 21, a timing generation circuit 22, and a system control circuit 23 are provided similarly to the conventional apparatus shown in FIG. 9, and the circuits 21, 22, and 23 have the same function as those in the conventional apparatus.

According to the present invention, a frame transfer type CCD is used as an example of the image pickup element 11 shown in FIG. 1. As shown in FIG. 3, the CCD of the image pickup elements 11 has an image sensing area 111 onto which an image of a not-shown subject is incident and a vertical register 112 for accumulating and transferring the signal charges generated in the image sensing area 111. The vertical register 112 is generally called an image storage area in a CCD of the frame transfer type. Further, three pairs of transfer gates 113 and horizontal registers 114 for three colors R, G, and B are provided under the image storage area 112 in the drawing.

Clocks $\phi_{PI}$ and $\phi_{PS}$ for vertically transferring the signal charges are applied to the image sensing area 111 and the storage area 112 respectively. Further, as shown in FIG. 4, R, G, and B vertical stripe filters are used as the color filters in the CCD 11. A clock $\phi_T$ is applied to each of the transfer gates 113 for the transfer of signal charges of the respective R, G, and B colors from the respective storage area 112 to the corresponding horizontal registers 114. Further, clocks $\phi_{S1}$, $\phi_{S2}$ and $\phi_{S3}$ are applied to the horizontal registers for R, G, and B colors respectively for horizontally transferring the signal charges in the left direction in the drawing. Each of those clocks $\phi_{PI}$, $\phi_{PS}$, $\phi_T$, $\phi_{S1}$, $\phi_{S2}$ and $\phi_{S3}$ is outputted from the CCD driving circuit 21 in accordance with a timing signal generated from the timing generation circuit 22 under the control of the system control circuit 23 shown in FIG. 1. That is, the CCD driving circuit 21 functions as a transfer control portion of the CCD 11.

Figure 5:
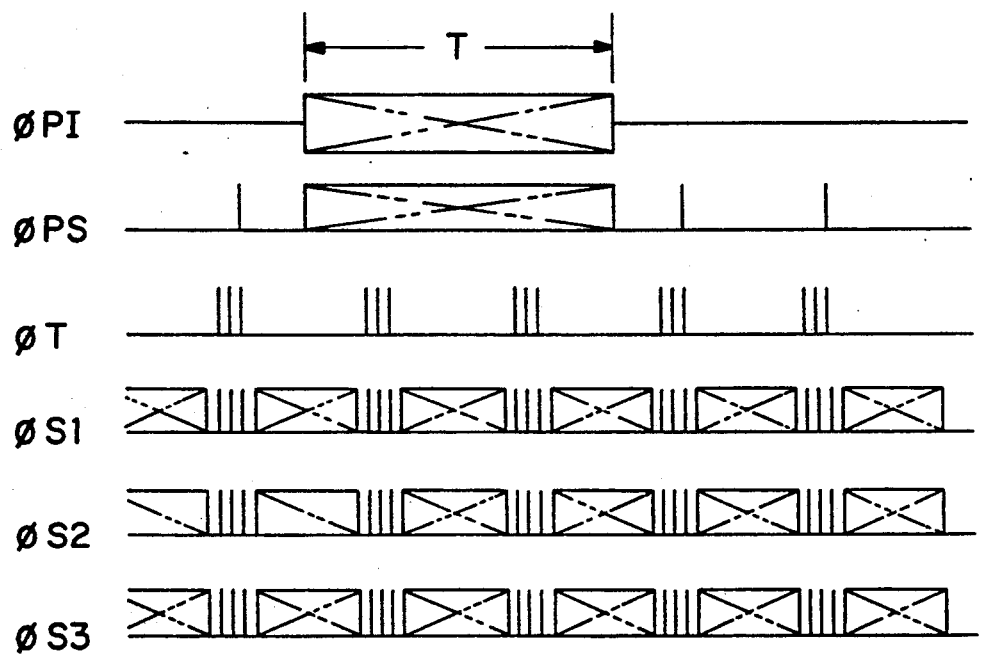
FIG. 5 is a timing diagram for explaining the timings of application of clocks in the transfer operation of FIG. 4.

Before the description of the operation of the present invention is provided, the general transfer operation of the CCD 11 will be described below by using FIG. 5.

The signal charge photoelectrically converted at an ordinary television rate for a period of 1/60 sec by the image sensing area 111 is transferred in a vertical blanking period of a television signal (a period T in FIG. 5) at a high rate to the storage area 112 in accordance with the clocks $\phi_{PI}$ and $\phi_{PS}$. Then, in every horizontal blanking period, signal charges of one horizontal line are transferred from the storage area 112 to the horizontal register 114. In this case, three pulses of the clock $\phi_T$ are applied to the transfer gates 113 every horizontal blanking period, so that the signal charges of the three colors R, G, and B are separately transferred in order to the three horizontal registers 114 respectively as shown in FIG. 4. That is, the signal charge of the color R is transferred in order to the horizontal register 114 on the upper row for the color B in accordance with the first pulse, to the horizontal register 114 on the middle row for the color G in accordance with the second pulse, and to the horizontal register 114 on the lower row for the color R in accordance with the third pulse; the signal charge of the color G is transferred to the horizontal register 114 on the upper row for the color G in accordance with the second pulse, and to the horizontal register 114 on the middle row for the color G in accordance with the third pulse; and the signal charge of the color B is transferred to the horizontal register 114 on the upper row for the color B in accordance with the third pulse. Then, after the application of the third pulse, the signal charge R for one line is transferred to the horizontal register 114 on the lower row for the signal R, the signal charge G for one line is transferred to the horizontal register 114 on the middle row for the signal G, and the signal charge B for one line is transferred to the horizontal register CCD 114 on the upper row for the signal B. Thus, the signal charges R, G, and B for one horizontal line are transferred to the horizontal registers 114 corresponding to the signal charges R, G, and B respectively, in every horizontal blanking period.

Thereafter, upon application of the horizontal transfer clocks $\phi_{S1}$, $\phi_{S2}$ and $\phi_{S3}$ to the corresponding horizontal registers 114 for the colors R, G, and B, the signal charges are transferred so that the signals R, G, and B are simultaneously supplied to corresponding amplifiers provided on the left end in the drawing.

Figure 7:
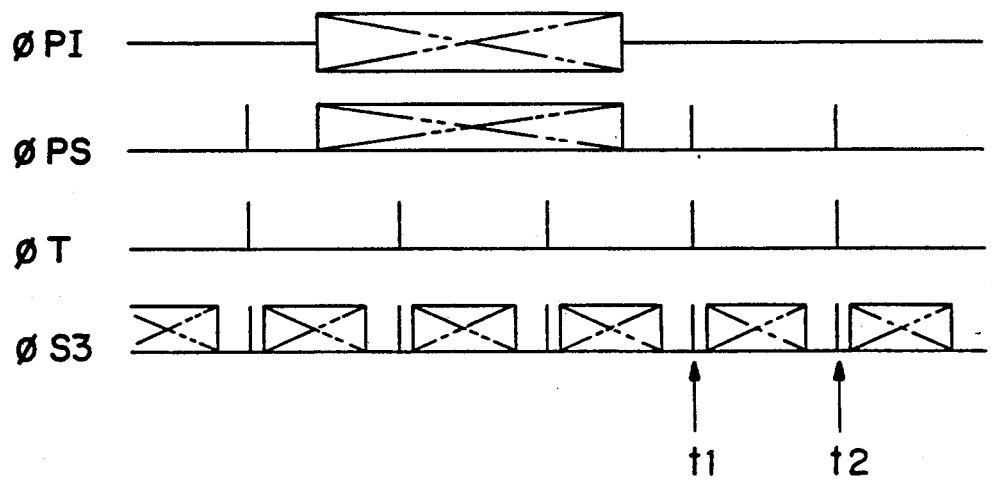
FIG. 7 is a timing diagram for explaining the timings of application of clocks in the transfer operation of FIG. 6.

Although the above description has been made as to the ordinary transfer operation, according to the present embodiment, the clocks are applied at the timings shown in FIG. 7 by the CCD driving circuit 21 which is the transfer control portion. Here, also in the present embodiment, it is the same that the photoelectrically converted signal charges are transferred from the image sensing area 111 to the storage area 112 in accordance with the clocks $\phi_{PI}$ and $\phi_{PS}$ at a high rate in each vertical blanking period of a television signal.

Figure 6A:
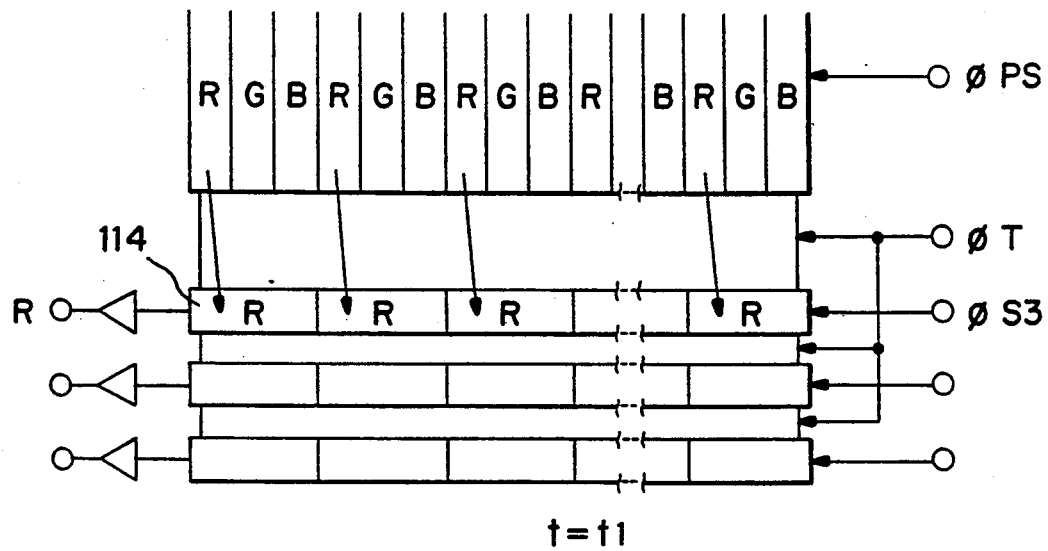
FIGS. 6(a) and 6(b) are front views for explaining the signal charge transfer operation according to the present invention by means of the image pickup element of FIG. 3.

According to the present embodiment, when the signal charges for one line are transferred from the storage area 112 to the horizontal registers 114 in a horizontal blanking period, only one pulse of the clock $\phi_T$ is applied to each of the transfer gates 113. For example, in the case of the color R, upon application of one pulse of the clock $\phi_T$ at a point of time $t_1$ in the horizontal blanking period shown in FIG. 7, a series of color signals for one line, that is, signal charges corresponding to the stripe filters for the same color R, are transferred from the storage area 112 to the horizontal register 114 on the upper row as shown in FIG. 6(a), and then the thus transferred signals R are horizontally transferred in accordance with the horizontal transfer clock $\phi_{S3}$ following the clock $\phi_T$ so as to be outputted.

Figure 6B:
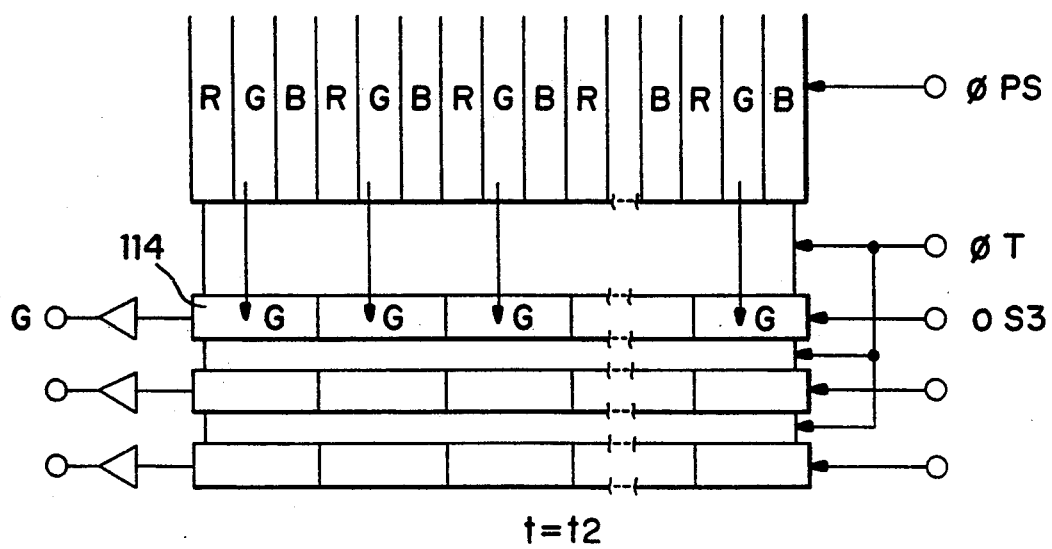

Further, in the succeeding horizontal blanking period, upon application of one pulse of the clock $\phi_T$ at a point of time $t_2$, a series of color signals for one line, that is, signal charges corresponding to the stripe filters for the same color G, are transferred from the storage area 112 to the horizontal register 114 on the upper row as shown in FIG. 6(b), and then the thus transferred signals G are horizontally transferred in accordance with the horizontal transfer clock $\phi_{S3}$ following the clock $\phi_T$ so as to be outputted.

Similarly, in the succeeding horizontal blanking period, a series of the color signals B are transferred to the horizontal register 114 on the upper row in accordance with one pulse of the clock $\phi_T$ and then horizontally transferred in accordance with the clock $\phi_{S3}$ so as to be outputted.

Through the operation described above, in every horizontal scanning period, all the signal charges of the horizontal scanning period are successively transferred and outputted in the order of the colors R, G, and B (that is called an in-line color-order signal). The above operation is repeated so that all the signal charges of one picture scene are transferred and outputted in the form of the in-line color-order signals. Accordingly, while the conventional apparatus shown in FIG. 9 requires three systems for the signal processing from the CCD 11 to the A/D converters 16, the signal processing according to the present embodiment, can be realized by only one system as shown in FIG. 1.

Further, by properly adjusting the pulse periods of the respective clocks $\phi_{PS}$, $\phi_T$ and $\phi_{S3}$ shown in FIG. 7, it is possible to read out the in-line color-order signal at a desired rate.

For example, assume that the processing rate of the DPCM encoding circuit is 100 nsec per picture element, and that the writing rate in the storage medium 20a is 250 nsec per 8 bits. Further assume that in the case where one-picture-element one-color 8-bit data is non-linearly converted into 4 bits through DPCM encoding, the non-linearly converted data is written in the storage medium 20a as an 8-bit data after two picture elements are processed. Then, the processing rate of the DPCM encoding circuit 18 is a rate of two picture elements per one writing, that is, 200 nsec per one writing. In this case, the writing rate (250 nsec) onto the storage medium 20a is lower than the encoding-processing rate (200 nsec), and the frequency of each pulse (pulse period) of the clocks $\phi_{PS}$, $\phi_T$ and $\phi_{S3}$ is set so that the horizontal transfer time of one picture element is within 250/2 nsec=125 nsec (but, not shorter than 100 nsec because the encoding processing time is 100 nsec per picture element).

Thus, after the data for two picture elements outputted from the CCD 11 has been encoded and recorded in the storage medium 20a, the next picture element data is outputted. Accordingly, such a large capacity of field memory 17 and buffer memory 19 as provided in the conventional apparatus in FIG. 9 become unnecessary in the apparatus of the present embodiment.

Further, since the charge transfer rate is selected so as to match with a lower processing rate, the present invention is easily applied to storage media different from each other in recording rate and to encoding processings different from each other in processing rate.

Further, in FIG. 1, color signals are outputted from the CCD 11 in the in-line color-order, and are passed through one white balance circuit 15. It is therefore necessary to control the amplification factor of a white balancing amplifier to be a value suitable for the white balance processing of the corresponding color signal for every timing at which each of the color signals are outputted.

Figure 8A:
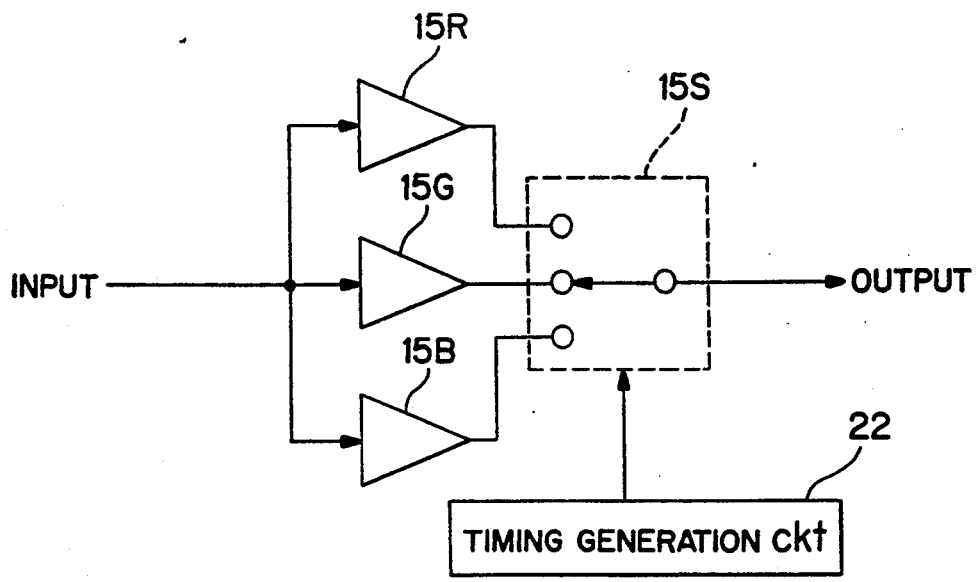
FIGS. 8(a) and 8(b) are circuit diagrams each showing the circuit configuration for obtaining a white balancing amplification factor for every color signal.

For example, as shown in FIG. 8(a), white balancing amplifiers 15R, 15G, and 15B in which amplification factors G1, G2, and G3 are set correspondingly to the color signals R, G, and B are prepared. A changeover switch 15S provided on the output sides of the amplifiers 15R, 15G, and 15B is switched in accordance with the control signal produced from the timing generation circuit 22 controlled by the system control circuit 23 in FIG. 1 so that a corresponding one of the amplifiers 15R, 15G, and 15B is selected at the timing at which a series of corresponding color signals are outputted.

Figure 8B:
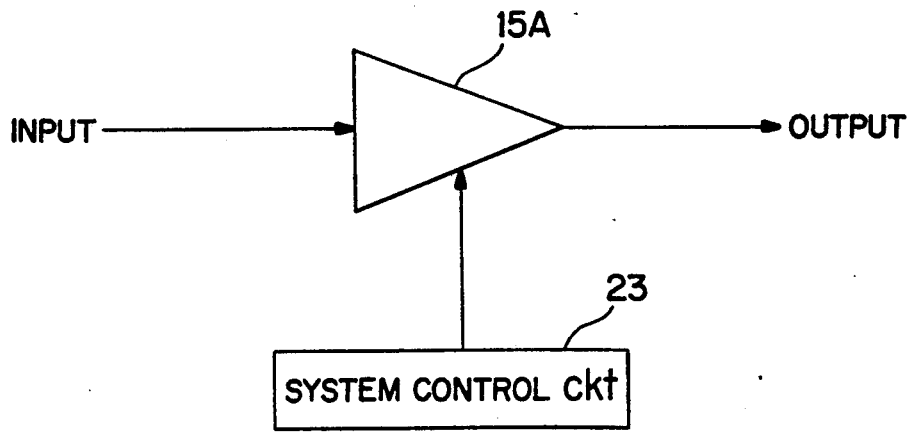

Alternatively, as shown in FIG. 8(b), an AGC (an automatic gain control) circuit 15A may be used as the white balancing amplifier. In this case, a white balancing gain is controlled so as to match with a corresponding color signal every output timing of a series of color signals in accordance with the control signal produced from the system control circuit 23 in FIG. 1. As the control signal, for example, a digital signal produced from the system control circuit 23 may be converted into an analog signal by use of a D/A converter so as to control the AGC circuit 15A.

In such a configuration, suitable white balancing processing can be carried out in accordance with an amplification factor suitably set to each corresponding color.

Figure 11:
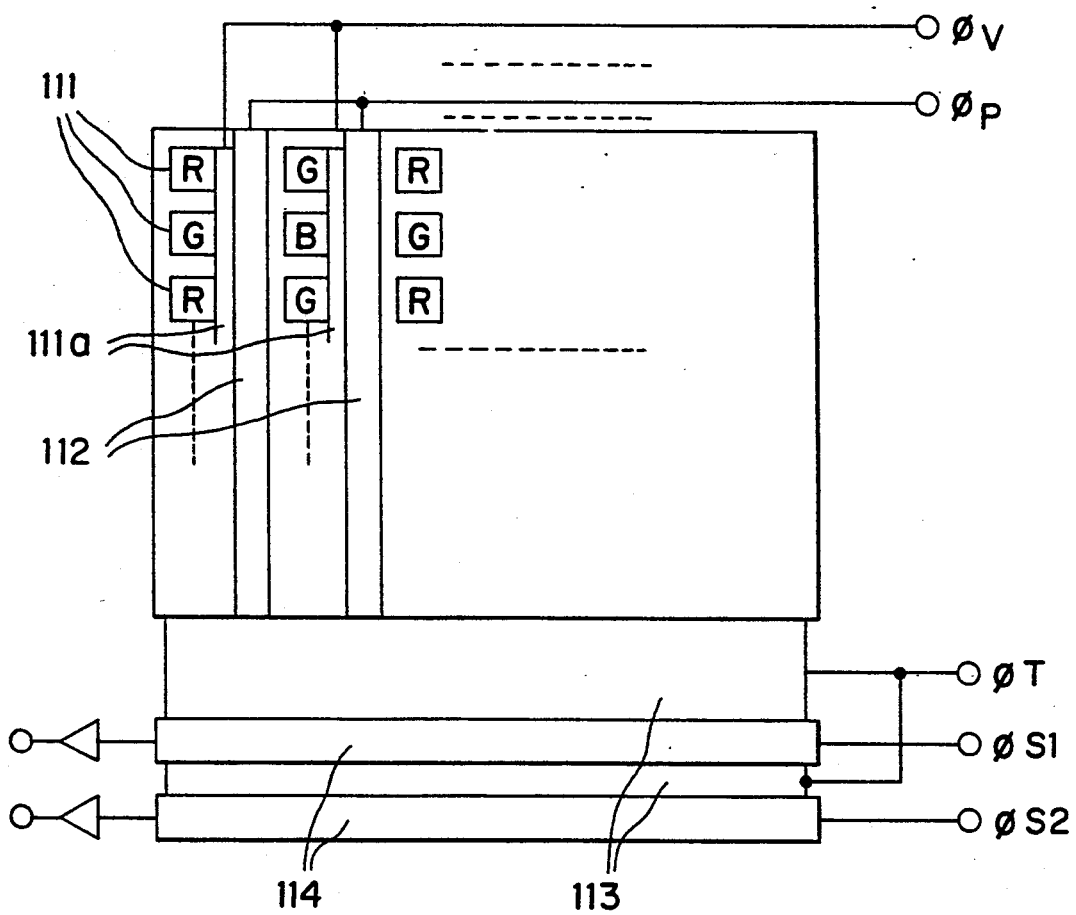
FIG. 11 is a front view for explaining the signal charge transfer operation in another embodiment.

Another embodiment in which an inter line type CCD shown in FIG. 11 is used as the CCD 11 will be described hereunder. In an inter line type CCD, generally, vertical registers 112 are called vertical transfer portions.

In the case of using such an interline transfer CCD, the timing of a horizontal transfer clock is adjusted so that the signals of the odd-numbered columns of the signal charges of a light detector portion 111 for optically converting one horizontal line are transferred into a horizontal register 114 on the upper stage in the drawing through a transfer gate 111a and a transfer gate 113, while the signals of the even-numbered columns are transferred into a horizontal register 114 on the lower stage in the drawing through the transfer gate 111a and the transfer gate 113. That is, of the signal charges on the first horizontal line (R, G, R, G . . . ), the signal charges R on the odd- numbered columns are transferred to the upper-stage horizontal register 114 and then outputted, and the signal charges G on the even-numbered columns are transferred to the lower-stage horizontal register 114 and then outputted. Further, of the signal charges on the second horizontal line (G, B, G, B . . .), the signal charges G on the odd-numbered columns are transferred to the upper-stage horizontal register 114 and then outputted and the signal charges B on the even-numbered columns are transferred to the lower-stage horizontal register 114 and then outputted. The signals on the third horizontal line and the succeeding horizontal lines are similarly operated.

As described above, according to the present embodiment, the signal processing circuits such as a gamma circuit, a white balance circuit, etc., and an A/D converter may be provided in one system, and such a large capacity of field memory and buffer memory for encoding processing become unnecessary, so that it is expected that the whole of the apparatus can be largely reduced in size and the cost can be reduced. The method of the present embodiment can be easily realized without requiring additional parts because it depends on the control of the timing and rate of the signal charge transfer of an image pickup element. Although the description has been made as to the case in which the invention is applied to an electronic still camera, the present invention is not limited to this but is applicable to the field of information communication such as a television telephone.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An image signal processing apparatus, comprising:
    vertical register means for storing and transferring color signals obtained as image signals related to at least three primary colors;
    horizontal register means for receiving said color signals transferred from said vertical register means;
    timing generation means for generating a transferring and outputting clock pulse frequency which corresponds to a lower one of a processing rate of an encoder for encoding image data on the basis of transferred and outputted signals and a storing rate of a storage medium for storing the encoded image data; and
    transfer control means for succeedingly transferring a series of color signals in response to said timing generation means for every color composed of a series of data of one and the same color for one line related to said three primary colors, to said horizontal register means in every horizontal blanking period, and for successively transferring and outputting said series of color signals transferred to said horizontal register means.

2. An image signal processing apparatus according to claim 1 further comprising a white balance circuit for processing the transferred and outputted color signals, said white balance circuit having a white-balancing amplification factor which is changed to have a value suitable for white balance processing of a corresponding color signal in synchronism with an output timing of each series of said color signals.

3. An image signal processing apparatus, comprising:

image pickup means for obtaining image signals related to at least three primary colors including,
  an image sensing area onto which an image of a subject is incident for generating said image signals,
  a vertical register for accumulating and transferring said image signals generated in said image sensing area, and
  horizontal register means for receiving said image signals from said vertical register;
timing generation means for generating a transferring and outputting clock pulse frequency which corresponds to a lower one of a processing rate of an encoder for encoding image data on the basis of transferred and outputted signals and a storing rate of a storage medium for storing the encoded image data; and
transfer control means for succeedingly transferring a series of color signals in response to said timing generation means for every color composed of a series of data of one and the same color for one line related to the three primary colors, to said horizontal register means in every horizontal blanking period, and for successively transferring and outputting said series of color signals transferred to said horizontal register means.

4. An image signal processing apparatus according to claim 3, wherein said image pickup means comprises a frame transfer type CCD.

5. A method of transfer control for image signals related to at least three primary colors from an image pickup element in an image signal processing apparatus, comprising the steps of:
  (a) storing and transferring color signals obtained by the image pickup element as the image signals;
  (b) receiving said color signals transferred from said step (a) by horizontal register means;
  (c) generating a transferring and outputting clock pulse frequency which corresponds to a lower one of a processing rate of an encoder for encoding image data on the basis of transferred and outputted signals and a storing rate of a storage medium for storing the encoded image data;
  (d) succeedingly transferring a series of color signals in response to said step (c) for every color composed of a series of data of one and the same color for one line related to the three primary colors to said horizontal register means in every horizontal blanking period; and
  (e) successively transferring and outputting said series of color signals transferred to said horizontal register means.

* * * * *